US012153325B2

(12) United States Patent
Koshobu et al.

(10) Patent No.: US 12,153,325 B2
(45) Date of Patent: Nov. 26, 2024

(54) WAVELENGTH CONVERTER

(71) Applicant: Nippon Telegraph and Telephone Corporation, Tokyo (JP)

(72) Inventors: Nobutatsu Koshobu, Musashino (JP); Koji Embutsu, Musashino (JP); Takeshi Umeki, Musashino (JP); Osamu Tadanaga, Musashino (JP); Takahiro Kashiwazaki, Musashino (JP); Takushi Kazama, Musashino (JP); Asuka Inoue, Musashino (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 64 days.

(21) Appl. No.: 17/919,965

(22) PCT Filed: Apr. 22, 2020

(86) PCT No.: PCT/JP2020/017284
§ 371 (c)(1),
(2) Date: Oct. 19, 2022

(87) PCT Pub. No.: WO2021/214897
PCT Pub. Date: Oct. 28, 2021

(65) Prior Publication Data
US 2023/0185157 A1 Jun. 15, 2023

(51) Int. Cl.
*G02F 1/35* (2006.01)
*G02F 1/383* (2006.01)
*H10N 10/13* (2023.01)

(52) U.S. Cl.
CPC ............ *G02F 1/3505* (2021.01); *G02F 1/383* (2013.01); *H10N 10/13* (2023.02); *G02F 1/3503* (2021.01)

(58) Field of Classification Search
None
See application file for complete search history.

(56) References Cited

U.S. PATENT DOCUMENTS 5,854,869 A * 12/1998 Joyce ..................... G02B 6/424
385/94
6,205,264 B1 * 3/2001 Jin ....................... G02B 6/4239
428/614

(Continued)

FOREIGN PATENT DOCUMENTS

JP 3753236 B2 3/2006

*Primary Examiner* — Rhonda S Peace
*Assistant Examiner* — R. Peace
(74) *Attorney, Agent, or Firm* — Workman Nydegger

(57) ABSTRACT

A wavelength converter stabilizes output light intensity in which the light coupling efficiency to a light waveguide core is not easily varied. A mounting structure is adopted in which a substrate of a wavelength conversion element is a material with a lower refractive index for signal light than that of the core, and a support structure that suppresses elastic deformation by supporting the element through a contact at a tip end surface at a position corresponding to both end portions of the core at the occurrence of elastic deformation due to the thermal stress of the element is provided. The support structure is provided at a portion apart from a temperature control element at the top surface of a metal housing bottom surface member, and its top surface is disposed in the vicinity of a portion corresponding to both end portions of the core of the element in a support member.

7 Claims, 10 Drawing Sheets

(56) References Cited

U.S. PATENT DOCUMENTS

| | | | | |
|---|---|---|---|---|
| 7,839,908 B2* | 11/2010 | Yanagisawa | ......... | H01S 3/0632 |
| | | | | 257/E23.105 |
| 8,743,916 B2* | 6/2014 | Yamamoto | ............ | H01S 3/1028 |
| | | | | 372/21 |
| 9,116,317 B2* | 8/2015 | Nasu | .................. | G02B 6/12004 |
| 9,459,417 B2* | 10/2016 | Nasu | ................... | G02B 6/4267 |
| 2019/0369339 A1* | 12/2019 | Knickerbocker | .... | G02B 6/4239 |
| 2023/0185157 A1* | 6/2023 | Koshobu | ............... | H10N 10/13 |
| | | | | 385/122 |

* cited by examiner

WAVELENGTH CONVERTER

TECHNICAL FIELD

The present invention relates to a wavelength converter with an improved mounting structure of a wavelength conversion element.

BACKGROUND ART

In the related art, light waveguides using periodically poled lithium niobate (hereinafter referred to as "PPLN") are known as an element capable of providing high wavelength conversion efficiency. To obtain such an operational effect, it is premised on the increase in light intensity due to light waveguides using PPLN used as a waveguide, and the use of a pseudo phase matching technique.

Light waveguides using PPLN have attracted attention as devices that play an important role in the field of next-generation optical fiber communication and the field of quantum computing. In addition, light waveguides using PPLN have been used as a parametric amplification element and an excitation light generation element that form a phase sensitive amplifier (PSA) capable of low-noise light amplification, and in such a case, high-gain and low-noise light amplification characteristics are achieved.

Meanwhile, in the field of quantum computing, optical coherent Ising machines have been achieved by inserting a light waveguide using PPLN into a fiber ring resonator and using it as a parametric oscillation element. It is reported that such an optical coherent Ising machine is capable of performing high speed and capacity calculations in comparison with known calculators. In order to further improve the performance of such a technique, it is important to achieve a wavelength converter with higher wavelength conversion efficiency than that of the prior art.

FIG. 1 is a schematic cross-sectional view illustrating, from a side surface direction, a basic configuration of a wavelength converter 100 of a well-known technique. Note that this wavelength converter 100 is disclosed in PTL 1, and has a function of generating a difference frequency by a Quasi-Phase-Matched (hereinafter referred to as "QPM") technique.

With reference to FIG. 1, this wavelength converter 100 includes a combiner 14, a wavelength conversion element 13, and a separator 15. The combiner 14 combines signal light $1a$ and control light $1b_{IN}$ for input. The separator 15 separates control light $1b_{OUT}$ for output and wavelength converted light $1c$ with a wavelength different from the wavelength of the wavelength-converted signal light $1a$ output from a wavelength conversion element 13A. The wavelength converted light $1c$ is a difference frequency light in an example.

Specifically, in the wavelength converter 100, the signal light $1a$ with a low light intensity and the control light $1b_{IN}$ for input with a high light intensity are entered into the combiner 14 and combined. The signal light $1a$ combined with the control light $1b_{IN}$ advances toward the wavelength conversion element 13 including a substrate 12 and a light waveguide core 11 disposed on the substrate 12. Note that the light waveguide core 11 has a periodically poled structure to produce a nonlinear optical effect. Further, this signal light $1a$ enters one end of the light waveguide core 11, and is converted to the wavelength converted light $1c$ with a wavelength different from that of the signal light $1a$ at the time when it passes through the light waveguide core 11, and emitted from the other end of the light waveguide core 11 together with the control light $1b_{IN}$. After entering the separator 15, the wavelength converted light $1c$ and the control light $1b_{OUT}$ emitted from the light waveguide core 11 are separated at the separator 15 into the wavelength converted light $1c$ and the control light $1b_{OUT}$ for output, and emitted from the separator 15.

In this wavelength converter 100, the control light $1b_{IN}$ with a high light intensity propagates in the wavelength conversion element 13 including the light waveguide core 11, and consequently the heat due to light absorption is generated at the light waveguide core 11 even when there is a slight light absorption. The light absorption and heat generation at the light waveguide core 11 result in a significant temperature rise of the wavelength conversion element 13.

There are several known methods of producing a wavelength conversion element, which is an optical element for performing wavelength conversion using the QPM technique. As an example of such a method is a method in which the substrate of the nonlinear optical crystal, which is the crystal that produces the nonlinear optical effect, is made into a periodically poled structure, and then the proton exchange waveguide is produced using the periodically poled structure. Likewise, there is also a method in which a ridge-type light waveguide is produced using photolithography and dry etching processes after the substrate of nonlinear optical crystal is made into a periodically poled structure.

Among them, PTL 1 corresponds to the case of producing the ridge-type light waveguide. In PTL 1, in the ridge-type light waveguide, a first substrate of a nonlinear optical crystal with a periodically poled structure and a second substrate with a refractive index smaller than the refractive index of the first substrate are bonded to each other in order to improve the light confinement effect. In this manner, a technique for producing a wavelength conversion element is disclosed. In addition, PTL 1 also discloses a technique in which a nonlinear optical crystal of the same type as that of the first substrate is used as the second substrate, and the first substrate and the second substrate are heated and diffusion bonded to avoid deterioration of adhesive agent and cracks due to temperature variation.

In the wavelength converter 100 including the wavelength conversion element, a configuration is known that uses a wavelength conversion element housed together with a combiner and a separator in a metal housing including an input/output port that enables input and output of light in order to practically prevent the degradation in characteristics due to variation of the use condition. Further, the wavelength conversion efficiency of the wavelength conversion element depends on the temperature, and it is necessary to control the temperature of the wavelength conversion element to maximize the wavelength conversion efficiency.

FIG. 2 is a schematic cross-sectional view illustrating, from a side surface direction, a basic configuration of a mounting structure 101 of the wavelength converter 100 illustrated in FIG. 1.

With reference to FIG. 2, the mounting structure 101 has a configuration in which a support member 27 is joined, by bonding or the like, on the substrate 12 side of the wavelength conversion element 13, and a temperature control element 26 is joined to the support member 27 with a joining member 23 interposed therebetween at the top surface of a metal housing bottom surface member 28. The joining member 23 plays a role of fixing the temperature control element 26 to the support member 27 joined to the wavelength conversion element 13 at the top surface of the metal housing bottom surface member 28. The support member 27 is a metal member for uniformly controlling the temperature of the entirety of the wavelength conversion element 13 including the light waveguide core 11 and the substrate 12. The temperature control element 26 is interposed between the support member 27 and the metal housing bottom surface member 28 to conduct heat between the temperature control element 26, the support member 27, and the metal housing bottom surface member 28, and is fixed and bonded by the joining member 23 that does not easily change the fixing position. The configuration and function of each unit of the wavelength converter 100 are as described with reference to FIG. 1.

In the case where the wavelength conversion element 13 using a ferroelectric crystal material is used for the wavelength converter 100, a phenomenon called light damage in which the refractive index of the wavelength conversion element 13 is changed and the characteristic is degraded through irradiation of light with a short wavelength is caused. As a method for reducing the influence of this light damage, a technique of using the wavelength conversion element 13 at high temperature has been proposed. To operate the wavelength conversion element 13 at high temperature, it is conceivable to use a method of heating a wavelength conversion element using a heat source such as a heater. For example, in the mounting structure 101 of the wavelength converter 100 illustrated in FIG. 2, it is necessary to control the temperature control of the wavelength conversion element 13 with high accuracy and a relatively high speed, and therefore it is preferable to use a Peltier element as the temperature control element 26. Here, the Peltier element is an element that uses a phenomenon of the Peltier effect, a type of thermoelectric effect, to create a temperature difference from a voltage. With a current supplied therethrough, the Peltier element provides an effect of causing heat absorption at one surface while generating heat at the other surface, and such a heat generation effect can be utilized.

In the case where the temperature of the wavelength conversion element 13 is set to a high temperature by using the Peltier element, but the following issues arise. Specifically, in the wavelength conversion element 13 that performs wavelength conversion using the QPM technique, commonly, the wavelength conversion efficiency is increased by increasing the light waveguide length. As such, commonly, the width of the light waveguide core 11, the substrate 12, and the support member 27 is set to be wider than the width of the temperature control element 26 in many cases. In the mounting structure 101 of the wavelength converter 100 illustrated in FIG. 2, the light waveguide core 11, the substrate 12, and the support member 27 protrude from the temperature control element 26. Further, the member including the light waveguide core 11, the substrate 12, and the support member 27 is mounted in a so-called cantilever beam structure at the surface of the temperature control element 26.

In the mounting structure 101 with a cantilever beam structure, the thermal expansion coefficients, thermal conductivities, and elastic moduli of the light waveguide core 11, the substrate 12, and the support member 27 are not equal to each other even when the light waveguide core 11, the substrate 12, and the support member 27 have the same temperature. As such, when the use temperature and the mounting temperature at fixing and bonding processes are different from each other, the thermal stress proportional to the temperature difference of the mounting temperature and the use temperature of the members x the thermal expansion coefficient difference of the members x the elastic modulus difference of the members is generated at the interface of each member.

In addition, examples of known materials of the quadratic nonlinear optical crystal include $LiNbO_3$, $KNbO_3$, $LiTaO_3$, and $KTiOPO_4$. This quadratic nonlinear optical crystal is known to have a relatively large thermal expansion coefficient although it depends on the crystal orientation. PPLN has a relatively large thermal expansion coefficient as with $LiNbO_3$, and is approximately 7.5 (ppm/° C.) in the Z axis (a-axis) direction and approximately 15.4 (ppm/° C.) equally in the X axis direction and the Y axis (c-axis) direction, at a room temperature around 25° C. Further, PPLN indicates a further high thermal expansion coefficient at around 300° C.

In view of this, assuming that in the mounting structure 101 of the wavelength converter 100 illustrated in FIG. 2, a nonlinear optical crystal is used for the light waveguide core 11 and the substrate 12, and a metal material is used for the support member 27, for example. In this case, the copper of the metal material indicates approximately 16.8 (ppm/° C.), which is a substantially close thermal expansion coefficient. However, zinc with approximately 30.2 (ppm/° C.), tin with approximately 26.9 (ppm/° C.), and aluminum with approximately 23 (ppm/° C.) and the like are greater than $LiNbO_3$. In addition, gold with approximately 14.3 (ppm/° C.), iron with approximately 12.1 (ppm/° C.), titanium with approximately 8.5 (ppm/° C.), nickel with approximately 13.3 (ppm/° C.), and silicon with approximately 2.8 to 7.3 ppm/° C. and the like are smaller than $LiNbO_3$. Further, even with a uniform temperature distribution, a thermal stress is generated between the light waveguide core 11 and the substrate 12 and the support member 27 in any case due to the temperature difference between the mounting temperature (at fixing and bonding processes) and the use temperature.

FIG. 3 is a schematic cross-sectional view, from a side surface direction, illustrating a state where a strain is generated due to the temperature difference during the wavelength conversion operation in the mounting structure 101 of the wavelength converter 100 of FIG. 2.

With reference to FIG. 3, during an actual use of the wavelength converter 100, a large temperature rise may be generated at the wavelength conversion element 13 due to light absorption and the like caused by an incidence of the control light with a high light intensity and the like as described above. In view of this, to reduce the temperature rise of the wavelength conversion element 13, it is necessary to control the temperature of the wavelength conversion element 13 to be a predetermined temperature during use by cooling it by the temperature control element 26. In this case, for example, the light waveguide core 11 has a high temperature whereas the temperature control element 26 has a low temperature, and thus a temperature gradient is generated between the light waveguide core 11, the substrate 12, and the support member 27 and the surface of the temperature control element 26. Consequently, it is predicted that a thermal expansion strain proportional to the product of the temperature difference between the mounting temperature (fixing and bonding temperature) and the use temperature of the members and the thermal expansion coefficient (linear expansion coefficient) occurs at each member.

However, in practice, each member is fixed and bonded with the joining member 23, and thus a thermal stress corresponding to the product of the thermal expansion coefficient difference of each member and the elastic modulus difference of each member is generated at the interface of between the members inside the wavelength conversion element 13. Specifically, the light waveguide core 11, the substrate 12, and the support member 27 are elastically deformed by the generated thermal stress as indicated by the double-headed down-arrow in FIG. 3 although it differs depending on the thermal expansion coefficient and elastic modulus according to the quality of the material used. This elastic deformation can be regarded as an elastic deformation of the wavelength conversion element 13 into a convex shape. In this case, the light input and output directions of the light waveguide core 11 is shifted from the lateral dotted line direction to the lateral solid line direction. That is, this elastic deformation becomes a cause of a warp of the wavelength conversion element 13 due to each thermal expansion coefficient difference of the light waveguide core 11, the substrate 12, and the support member 27, and a positional displacement of the mounting position of an end portion of the light waveguide core 11.

In the mounting structure 101 of the wavelength converter 100, when an elastic deformation is caused at each member, the light coupling efficiency of the signal light and the control light with a high light intensity to the light waveguide core 11 varies, and the effective refractive index of the light waveguide core 11 varies due to the photoelastic effect of the thermal stress. Consequently, the wavelength conversion efficiency varies and the light intensity of the output of the wavelength converter 100 varies.

In short, in the functional configuration of the mounting structure 101 of the wavelength converter 100 in the prior art, the light coupling efficiency to the light waveguide core 11 easily varies, and the light intensity of the output easily varies due to a variation of the effective refractive index of the light waveguide core 11 due to the photoelastic effect of the thermal stress.

CITATION LIST

Patent Literature

PTL 1: JP 3753236 B

SUMMARY OF THE INVENTION

The present invention is intended to solve the above-described issues. An object of the embodiments of the present invention is to provide a wavelength converter having a functional configuration with a stable output of the light intensity in which the light coupling efficiency to the light waveguide core is not easily varied, and the effective refractive index of the light waveguide core is not easily varied due to the photoelastic effect of the thermal stress.

To achieve the above-mentioned object, a wavelength converter according to an aspect of the present invention is configured to generate light with a wavelength different from a wavelength of a signal light when the signal light is input, the wavelength converter including a wavelength conversion element including a substrate as a base with a light waveguide core at one main surface, the substrate having a lower refractive index for the signal light than the light waveguide core, the wavelength conversion element being configured to convert the wavelength of the signal light, a temperature control element joined to a portion excluding both end portions in another main surface of the substrate, and configured to support the wavelength conversion element and control a temperature of the wavelength conversion element, a support structure configured to support the wavelength conversion element through a contact at a tip end surface at a position corresponding to at least one end portion of the light waveguide core in the other main surface of the substrate at occurrence of elastic deformation due to a thermal stress during wavelength conversion of the wavelength conversion element; and a metal housing bottom surface member disposed at a bottom surface inside a metal housing configured to house the wavelength conversion element, the metal housing bottom surface member being a member where the support structure is provided. The support structure is provided at a portion apart from the temperature control element at a top surface of the metal housing bottom surface member, and the tip end surface is disposed in a vicinity of the position in the other main surface of the substrate.

With the configuration of the above-mentioned aspect, it is possible to control the variation in light coupling efficiency of the wavelength conversion element due to the elastic deformation caused by the thermal stress due to the temperature gradient and the thermal expansion coefficient difference between the wavelength conversion element and the support structure. In this manner, the light coupling efficiency to the light waveguide core is not easily varied, and the effective refractive index of the light waveguide core is not easily varied due to the photoelastic effect of the thermal stress, and thus, the light intensity of the output is stabilized. As a result, the wavelength converter can control the output power intensity of wavelength-converted light even when it is applied to an optical module that requires the same high light intensity incidence, and thus the light transmission path can be stably operated.

BRIEF DESCRIPTION OF DRAWINGS

FIG. 7($a$) is a corresponding diagram of a schematic cross-sectional view in the case where the position control of the tip end surface of the support structure is not performed and resulting optical characteristics. FIG. 7(b) is a corresponding diagram of a schematic cross-sectional view in the case where the position control of the tip end surface of the support structure is performed and resulting optical characteristics.

FIG. 9(a) is a diagram illustrating optical characteristics representing a relationship between the height (position) of a light waveguide core of a wavelength converter and the temperature. FIG. 9(b) is a schematic cross-sectional view illustrating, from a side surface direction, the mounting structure of the wavelength converter during temperature control.

DESCRIPTION OF EMBODIMENTS

Wavelength converteres according to embodiments of the present invention will be described below with reference to the accompanying drawings.

First Embodiment

Figure 4:
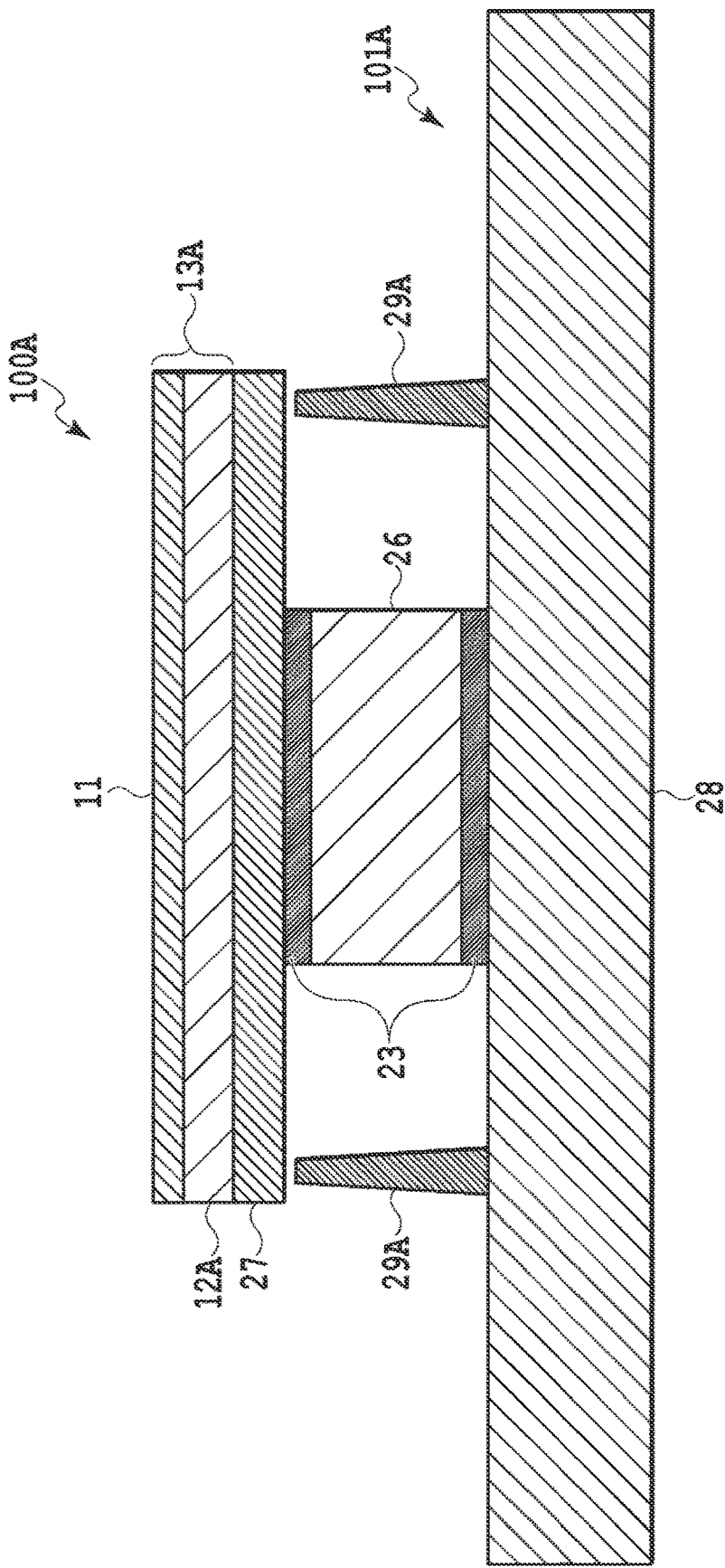
FIG. 4 is a schematic cross-sectional view illustrating, from a side surface direction, a basic configuration of a mounting structure of a wavelength converter according to a first embodiment of the present invention.

FIG. 4 is a schematic cross-sectional view illustrating, from a side surface direction, a basic configuration of a mounting structure 101A of a wavelength converter 100A according to a first embodiment of the present invention.

Figure 1:
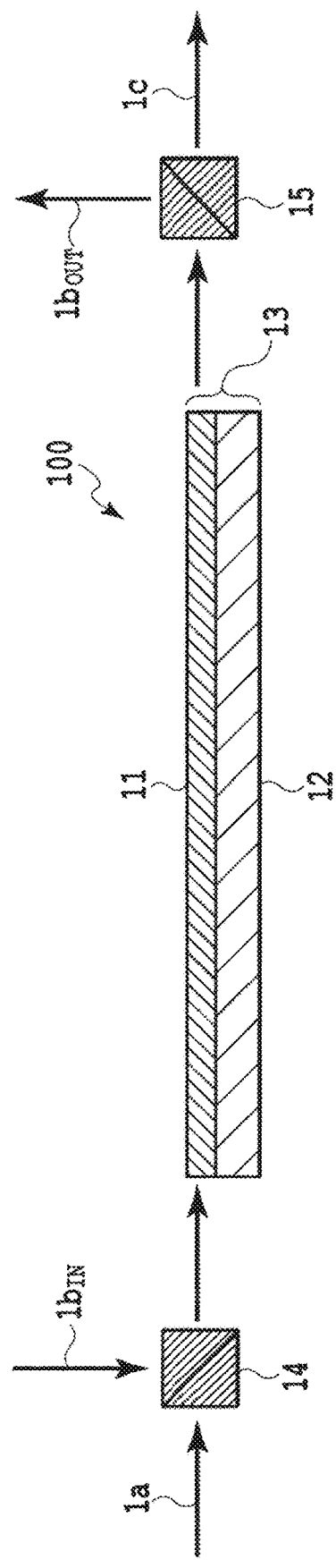
FIG. 1 is a schematic cross-sectional view illustrating, from a side surface direction, a basic configuration of a wavelength converter by a well-known technique.
Figure 2:
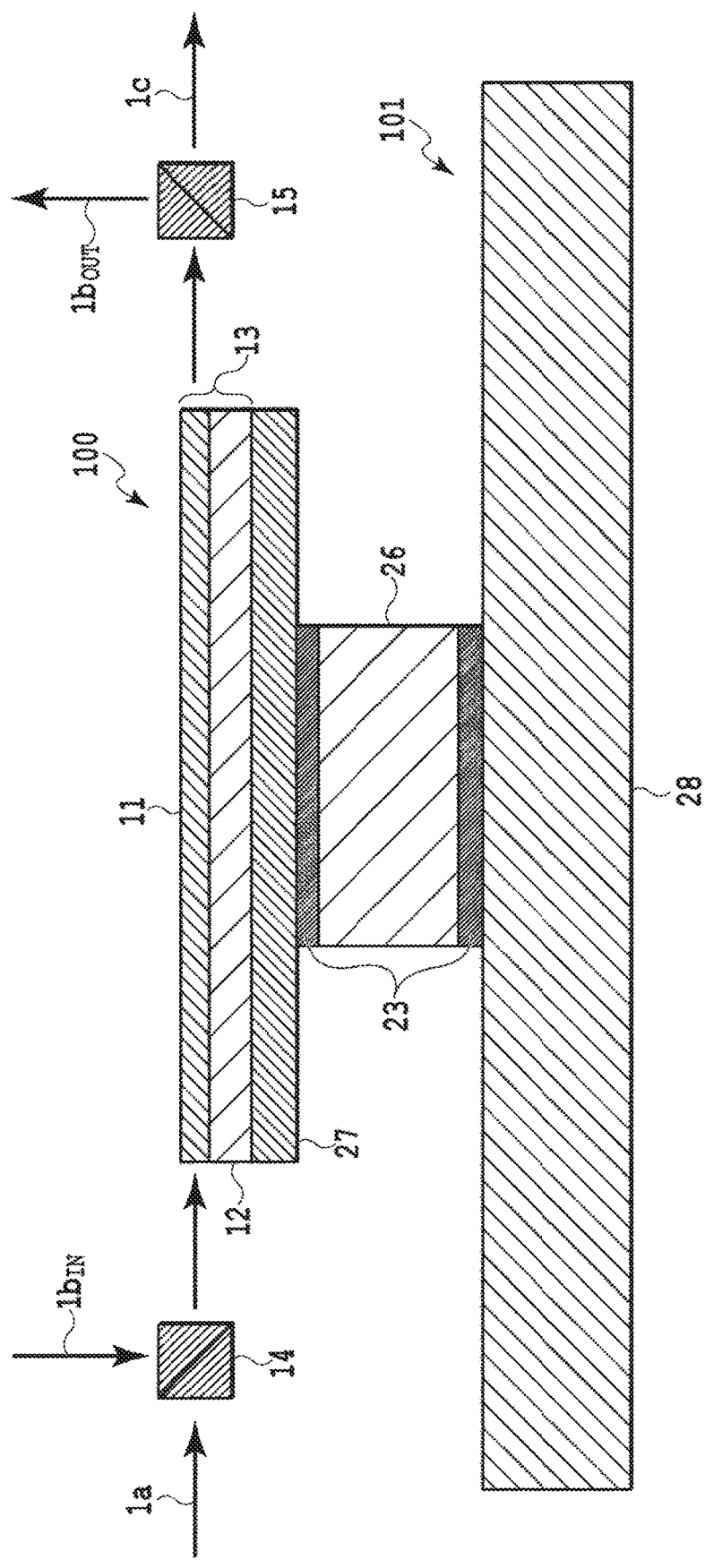
FIG. 2 is a schematic cross-sectional view illustrating, from a side surface direction, a basic configuration of a mounting structure of the wavelength converter illustrated in FIG. 1.
Figure 3:
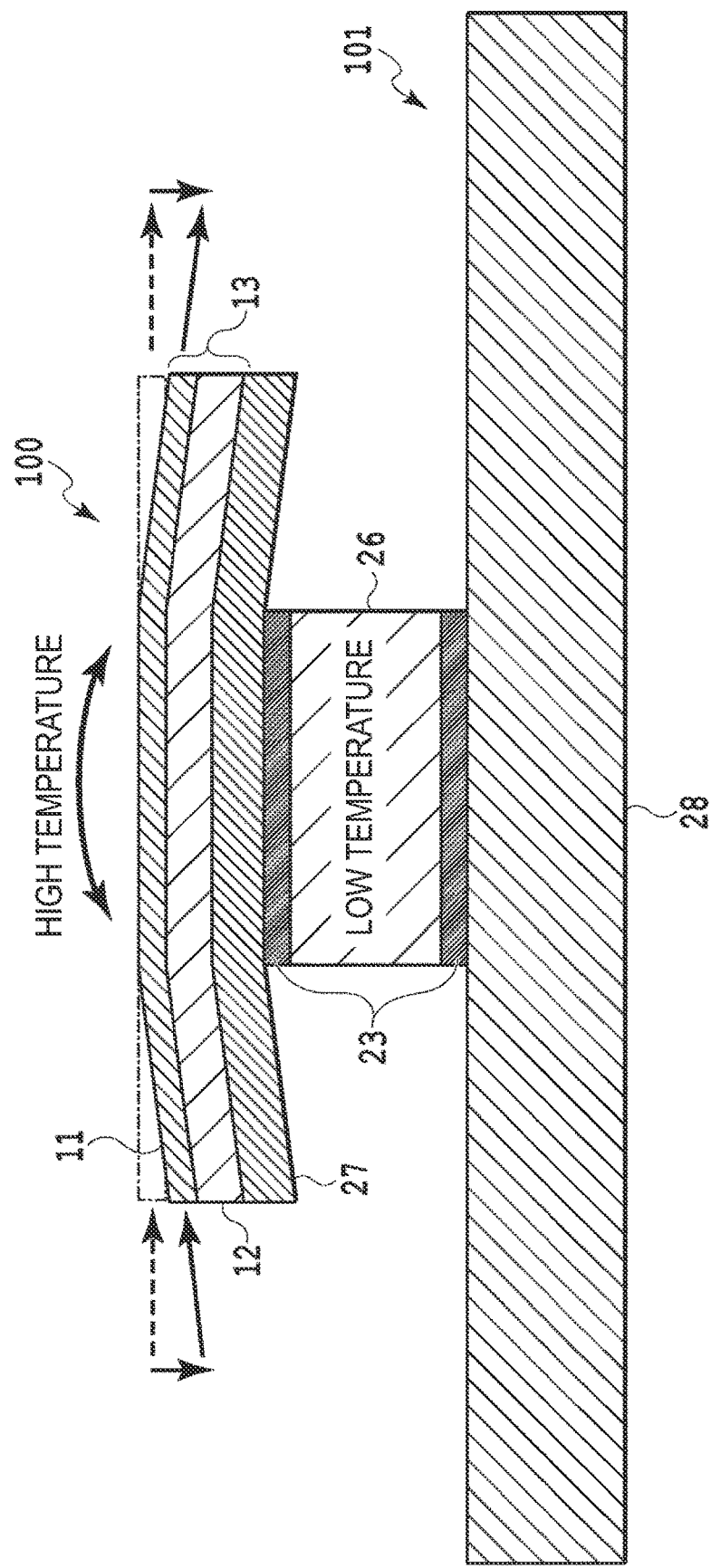
FIG. 3 is a schematic cross-sectional view illustrating, from a side surface direction, a state where a strain is generated due to a temperature difference during a wavelength conversion operation in a mounting structure of the wavelength converter of FIG. 2.

With reference to FIG. 4, in the mounting structure 101A of the wavelength converter 100A, the detailed configuration of the wavelength conversion element 13A of the wavelength converter 100A is the same as that of the wavelength converter 100 described with reference to FIG. 2. Specifically, the wavelength converter 100A includes the wavelength conversion element 13A, the combiner 14, and the separator 15 (not illustrated in the drawing). The wavelength conversion element 13A is provided with the light waveguide core 11 at one main surface and includes, as a base, a substrate 12A having a lower refractive index for signal light than the light waveguide core 11. The wavelength conversion element 13A is a waveguide type, and its polarization is periodically inverted. The wavelength conversion element 13A generates light of a wavelength different from that of signal light when the signal light is input. In addition, also in the wavelength converter 100A, one main surface of the support member 27 is joined by bonding or the like on the other main surface of the substrate 12A of the wavelength conversion element 13A. Here, the wavelength converter 100A is also housed in the metal housing, and the metal housing bottom surface member 28 is disposed at the bottom surface of the metal housing.

In the mounting structure 101A, the temperature control element 26 interposed between the joining members 23 is interposed and joined between a portion excluding both end portions of the other main surface of the support member 27 and the top surface of the metal housing bottom surface member 28 opposite to that portion. Here, the joining member 23 is provided at the top surface and the bottom surface of the temperature control element 26 in the thickness direction of the substrate 12A. In this manner, the joining member and the temperature control element 26 that controls the temperature of the wavelength conversion element 13A support the wavelength conversion element 13A. In addition, the mounting structure 101A includes a support structure 29A provided at a portion separated from the temperature control element 26 at the top surface of the metal housing bottom surface member 28.

This support structures 29A is disposed such that its tip end surface is close to portions corresponding to both end portions of the light waveguide core 11 in the other main surface of the support member 27. Further, at the occurrence of elastic deformation due to the thermal stress during wavelength conversion of the wavelength conversion element 13A, the support structure 29A can support the wavelength conversion element 13A through the contact at the tip end surface at the position in the other main surface of the support member 27. That is, the structure of the mounting structure 101A of the wavelength converter 100A can be regarded as a both-end beam structure for reducing the elastic deformation due to the thermal stress of the wavelength conversion element 13A.

For example, for each part, any material of $LiNbO_3$, $KNbO_3$, $LiTaO_3$, $LiNb(x)Ta(1-x)O_3$ (where $0 \leq x \leq 1$) and $KTiOPO_4$ is used for the substrate A. In addition, a material containing at least one selected from Mg, Zn, Sc, and In as an additive in the above-mentioned materials may be used for the substrate 12A.

Desirably, the support structure 29A is a material with a higher elastic modulus than that of the light waveguide core 11, the substrate 12A, and the support member 27. In addition, because the support structure 29A needs to support the elastic deformation due to the thermal stress of the light waveguide core 11, the substrate 12A, and the support member 27, it is desirable that the support structure 29A be formed of a material with a higher elastic modulus than that of these members. In any case, the tip end surface of the support structure 29A need not be bonded and fixed to the other main surface of the support member 27, and can contact and support the wavelength conversion element 13A that is elastically deformed and warped toward the metal housing bottom surface member 28.

Incidentally, this wavelength conversion element 13A may have a structure in which the support member 27 is not bonded on the substrate 12A. The support structure 29A of such a case has a configuration in which the tip end surface is disposed in the proximity of a position corresponding to at least one end portion of the light waveguide core 11 in the other main surface of the substrate 12A. Thus, the support structure 29A can support the wavelength conversion element 13A through the contact at the tip end surface at a position in the other main surface of the substrate 12A corresponding to at least one end portion of the light waveguide core 11 at the occurrence of elastic deformation of the wavelength conversion element 13A. Note that the relationship between the structure of the wavelength conversion element 13A and the support structure 29A is applied also to the structure of a wavelength conversion element 13B and a support structure 29B in the second embodiment described later, and the relationship between the structure of a wavelength conversion element 13C and a support structure 29C in the third embodiment described later.

The mounting structure 101A of the wavelength converter 100A described above is provided with the support structure 29A that can suppress the elastic deformation by supporting the wavelength conversion element 13A at positions corresponding to both end portions of the light waveguide core 11 in the support member 27 at the occurrence of elastic deformation. In addition, the substrate 12A of the wavelength conversion element 13A is a material with a lower refractive index for signal light than the light waveguide core 11. In this manner, it is possible to control the variation in light coupling efficiency of the wavelength conversion element 13A due to the elastic deformation caused by the thermal stress due to the temperature gradient and the thermal expansion coefficient difference between the wavelength conversion element 13A and the support structure 29A.

In this manner, the wavelength converter 100A that applies the mounting structure 101A does not easily cause the variation in light coupling efficiency to the light waveguide core 11 and the variation in effective refractive index of the light waveguide core 11 due to the photoelastic effect of the thermal stress, and thus the light intensity of the output is stabilized. As a result, the wavelength converter 100A can control the output power intensity of wavelength-converted light even when it is applied to an optical module that requires the same high light intensity incidence, and thus the light transmission path can be stably operated.

Second Embodiment

Figure 5:
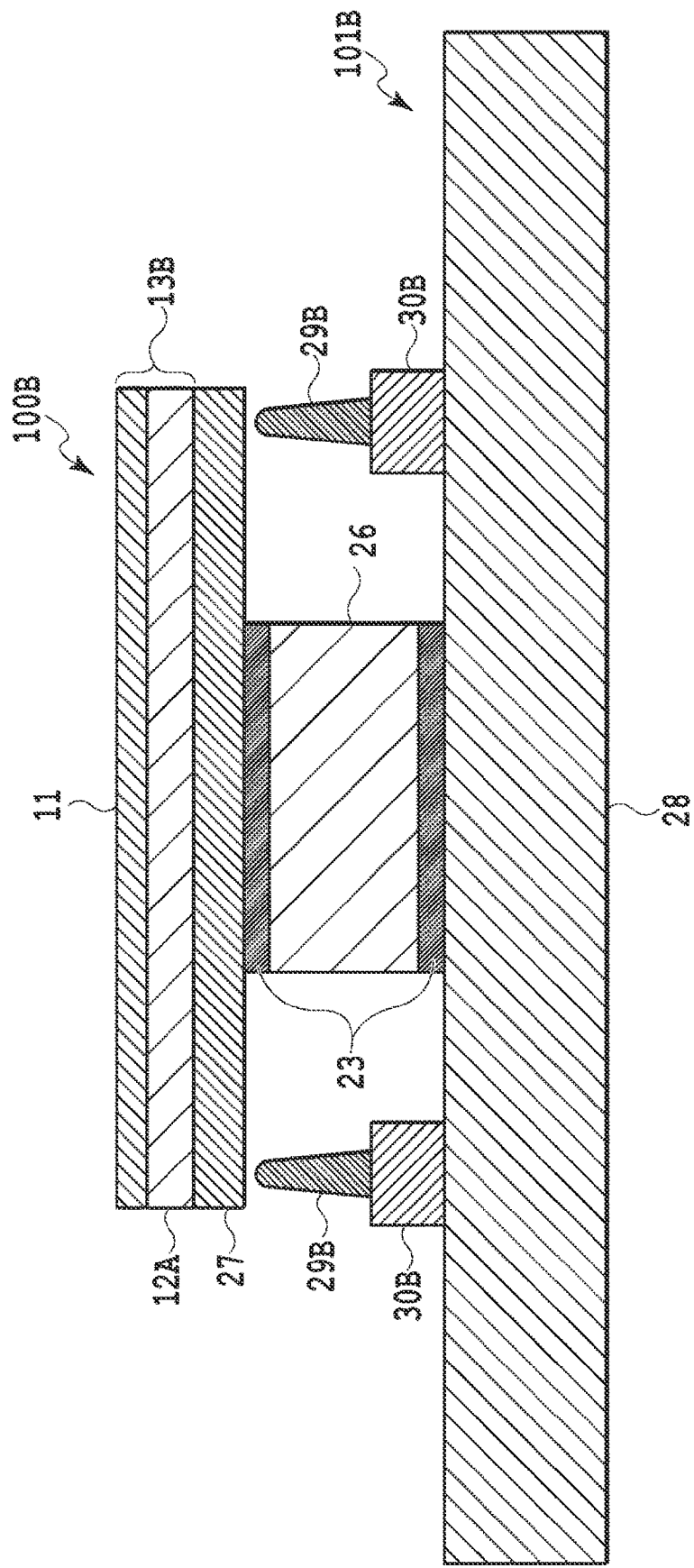
FIG. 5 is a schematic cross-sectional view illustrating, from a side surface direction, a basic configuration of a mounting structure of a wavelength converter according to a second embodiment of the present invention.

FIG. 5 is a schematic cross-sectional view illustrating, from a side surface direction, a basic configuration of a mounting structure 101B of a wavelength converter 100B according to a second embodiment of the present invention.

With reference to FIG. 5, in the mounting structure 101B of this wavelength converter 100B, the support structure 29B with a small height is provided on the top surface of the metal housing bottom surface member 28 with a thickness control member 30B interposed therebetween at a portion separated from the temperature control element 26. Other configurations are identical to those of the first embodiment. Specifically, the wavelength converter 100B includes the wavelength conversion element 13B, the combiner 14, and the separator 15 (not illustrated in the drawing). The wavelength conversion element 13b is provided with the light waveguide core 11 at one main surface and includes, as a base, the substrate 12B having a lower refractive index for signal light than the light waveguide core 11. The wavelength conversion element 13B is a waveguide type, and its polarization is periodically inverted. The wavelength conversion element 13B generates light of a wavelength different from that of signal light when the signal light is input. In addition, also in this wavelength converter 100B, one main surface of the support member 27 is joined by bonding or the like on the other main surface of the substrate 12B of the wavelength conversion element 13B. The material of the substrate 12B is the same as the material of the substrate 12A described above in the first embodiment.

For the thickness control member 30B, a piezoelectric element in which both sides of a piezoelectric body such as lead zirconate titanate (PZT) is sandwiched by the electrode surface in an example. In mounting the support structure 29B to at the surface of the metal housing bottom surface member 28 during assembly, the thickness control member 30B that controls the applied voltage by sandwiching a piezoelectric element whose height (position) varies, at a lower portion of the other main surface of the support structure 29B. In this manner, a high height control function of the tip end surface of the support structure 29B can be achieved.

The piezoelectric element has the property of generating strain or stress in its crystal when an electric field is applied, and a polarization or potential gradient electric field is generated inside the crystal with an external stress. Therefore, the piezoelectric element is applicable for measuring the stress applied to the support structure 29B. In addition, as another method, in the case where the thermal conductivity of the support structure 29B itself is small, a thermally expanding material such as metal combined with a temperature control element such as a heater may be simply sandwiched at a lower portion of the support structure 29B. In this case, it is also possible to control the height position of the tip end surface of the support structure 29B.

In any case, the support structure 29B includes an expansion and contraction mechanism, and the support structure 29B expands and contracts in a direction perpendicular to one main surface of the substrate 12B with respect to the light propagation direction of the light waveguide core 11 at one main surface of the substrate 12B. Such support structure 29B is also not fixed to the positions corresponding to both end portions of the light waveguide core 11 of the wavelength conversion element 13B in the other main surface of the support member 27. In this manner, it is possible to control the height of the end position of the light waveguide core 11 with high accuracy. With this mounting structure 101B, the thickness control member 30B functions as the expansion and contraction mechanism.

Here, assuming that the light waveguide core 11, the substrate 12B, and the support member 27 elastically deform due to the thermal stress during the wavelength conversion operation of the wavelength conversion element 13A of the wavelength converter 100B. In this case, when the support structure 29B supports the support member 27 at portions corresponding to both end portions of the light waveguide core 11, the contact positions of the support member 27 and the support structure 29B are not always the same positions and move. That is, because the support member 27 and the support structure 29B thermally expand in the light propagation direction of the light waveguide core 11, the contact portion can be regarded as constantly moving.

Figure 6:
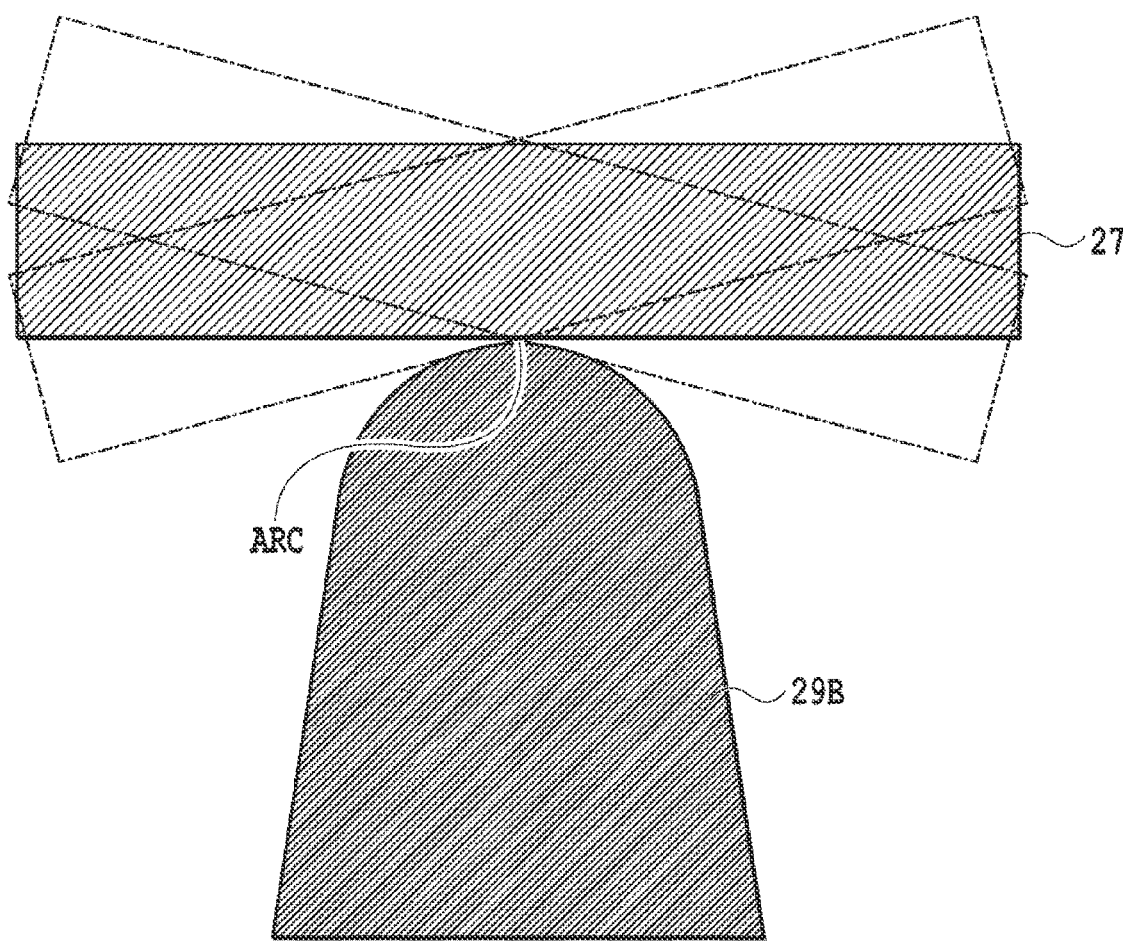
FIG. 6 is an enlarged schematic cross-sectional view illustrating a state of a contact at the occurrence of elastic deformation between a support structure and a support member provided in the mounting structure of the wavelength converter of FIG. 5.

FIG. 6 is an enlarged schematic cross-sectional view illustrating a state of contact, at the occurrence of elastic deformation, between the support member 27 provided in the mounting structure 101B of the wavelength converter 100B and the support structure 29B.

FIG. 6 illustrates a state where the contact portion between the support member 27 and the tip end surface of the support structure 29B moves at the occurrence of elastic deformation due to thermal stress during the wavelength conversion operation of the wavelength conversion element 13A of the wavelength converter 100B. Here, such that the contact area of the contact portion of the support member 27 and the tip end surface of the support structure 29B can be always the same, the shape of the tip end surface of the support structure 29B. More specifically, it is desirable to set the shape of the tip end surface of the support structure 29B to the cross section of an arc ARC that is uniform at the angle corresponding to the contact angle of the support member 27 as illustrated in FIG. 6.

With a structure in which the contact area of the support member 27 and the support structure 29B is always the same, the bottom surface of the support member 27 and the tip end surface of the support structure 29B come into contact with each other at the parallel surface at the occurrence of elastic deformation. This makes the contact stress constant, and the thermal conduction amount of the thermal conduction from the support member 27 to the support structure 29B can be kept constant, and thus, the support structure 29B can stabilize both end positions of the light waveguide core 11. To reduce the influence of the thermal conduction due to the contact, it is desirable that the area where the tip end surface of the support structure 29B contact the support member 27 be small.

Figure 7:
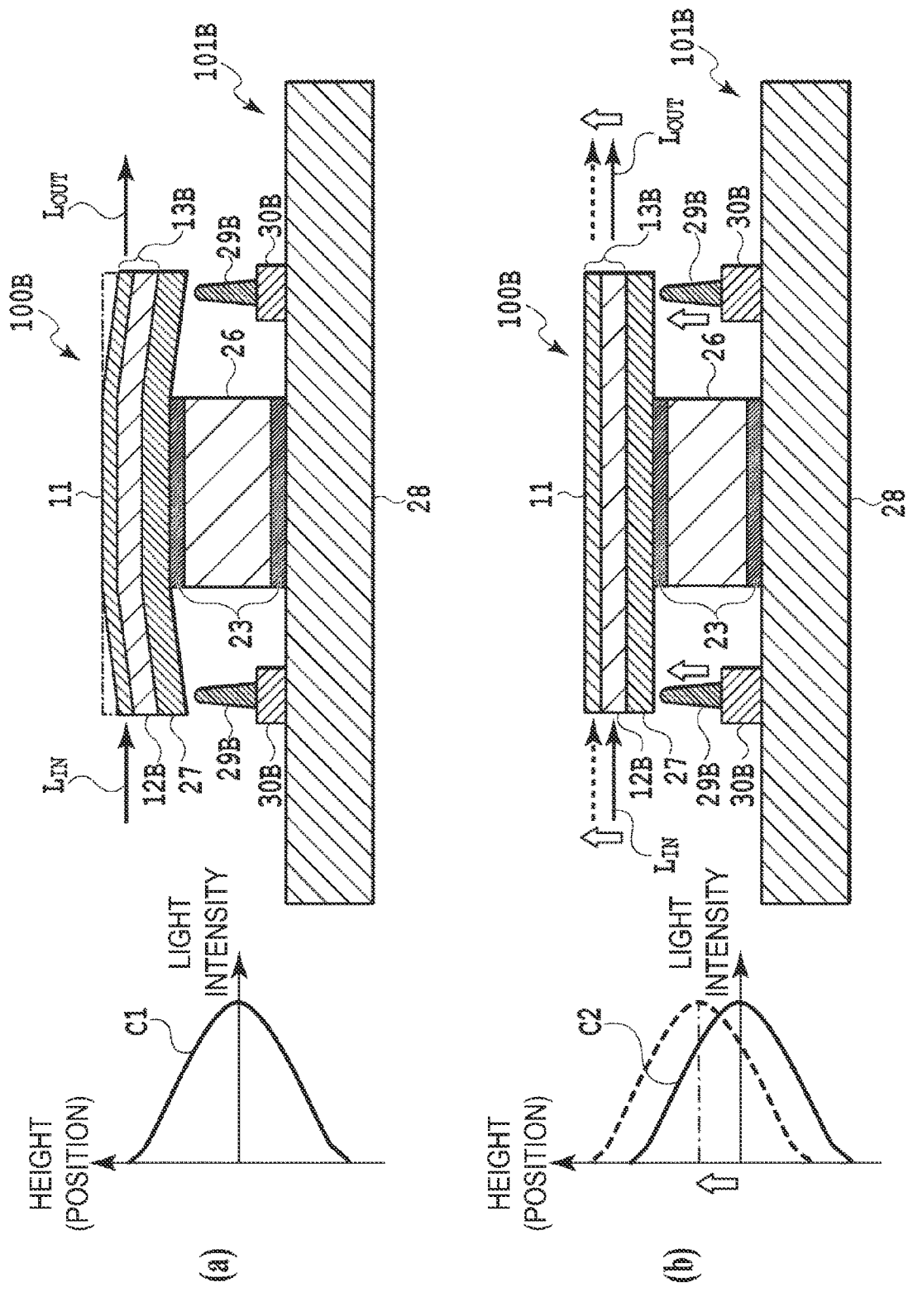
FIG. 7 is a corresponding diagram of a schematic cross-sectional view and optical characteristics illustrating a relationship between a position control operation of a tip end surface of the support structure in the mounting structure of the wavelength converter of FIG. 5 and light intensity characteristics according to the height.

FIG. 7 is a corresponding diagram of a schematic cross-sectional view and optical characteristics illustrating a relationship between a position control operation of the tip end surface of the support structure 29B and the light intensity characteristics in accordance with height (position) in the mounting structure 101B kj of the wavelength converter 100B. FIG. 7(a) is a corresponding diagram of a schematic cross-sectional view in the case where the position control of the tip end surface of the support structure 29B is not performed, and resulting optical characteristics. FIG. 7(b) is a corresponding diagram of a schematic cross-sectional view in the case where the position control of the tip end surface of the support structure 29B is performed, and resulting optical characteristics.

With reference to FIG. 7(a), in the case where the position control of the tip end surface of the support structure 29B is not performed, the light waveguide core 11, the substrate 12B, and the support member 27 are elastically deformed in a convex shape as indicated by the double-headed down-arrow. Assuming that such elastic deformation occurs, the optical axis needs to be adjusted such that the light coupling efficiency is maximized at both end positions of the light waveguide core 11 in optical characteristics C1 illustrated in the drawing. Here, the maximum value of the light coupling efficiency indicates that the overlap integral of the light intensity distribution of incident light $L_{IN}$ and emission light $L_{OUT}$, and the light intensity distribution of propagation light of the light waveguide core 11 is the maximum.

With reference to FIG. 7(b), in the case where the position control of the tip end surface of the support structure 29B is performed, the end portion position of the light waveguide core 11 is controlled with the tip end surface of the support structure 29B by operating the expansion and contraction mechanism of the thickness control member 30B. Here, the optical axis needs to be adjusted to change from the optical characteristics C1 to optical characteristics C2. The optical axis needs to be adjusted so as to reduce the light coupling efficiency, which is the overlap integral of the light intensity distribution of the incident light $L_{IN}$ and the emission light $L_{OUT}$, and the light intensity distribution of the light waveguide core 11. Here, the light coupling efficiency changes when the light intensity of the emission light $L_{OUT}$ is adjusted through the control of the height (position) of the tip end surface of the support structure 29B, and in this case, the light coupling efficiency is reduced. In addition, here, to reduce the light coupling efficiency, the support structure 29B is not necessarily provided at the surface of the metal housing bottom surface member 28, and is required to be installed such that the position of the tip end surface can be controlled in in the vertical direction of the light waveguide core 11. This also applies to the support structure 29A of the first embodiment described above, and the support structure 29C of the third embodiment described later.

In the mounting structure 101B of the wavelength converter 100B described above, the support structure 29B is provided at the top surface of the metal housing bottom surface member 28 with the thickness control member 30B interposed therebetween. In addition, the height of the tip end surface of the support structure 29B can be controlled by the expansion and contraction mechanism of the thickness control member 30B. Thus, it is possible to accurately control the variation in light coupling efficiency of the wavelength conversion element 13B due to the elastic deformation caused by the thermal stress due to the temperature gradient and the thermal expansion coefficient difference between the wavelength conversion element 13B and the support structure 29B.

In this manner, the wavelength converter 100B that applies the mounting structure 101B does not easily cause the variation in light coupling efficiency to the light waveguide core 11 and the variation in effective refractive index of the light waveguide core 11 due to the photoelastic effect of the thermal stress, and thus the light intensity of the output is stabilized. As a result, the wavelength converter 100B can control the output power intensity of wavelength-converted light even when it is applied to an optical module that requires the same high light intensity incidence, and thus the light transmission path can be stably operated.

Third Embodiment

Figure 8:
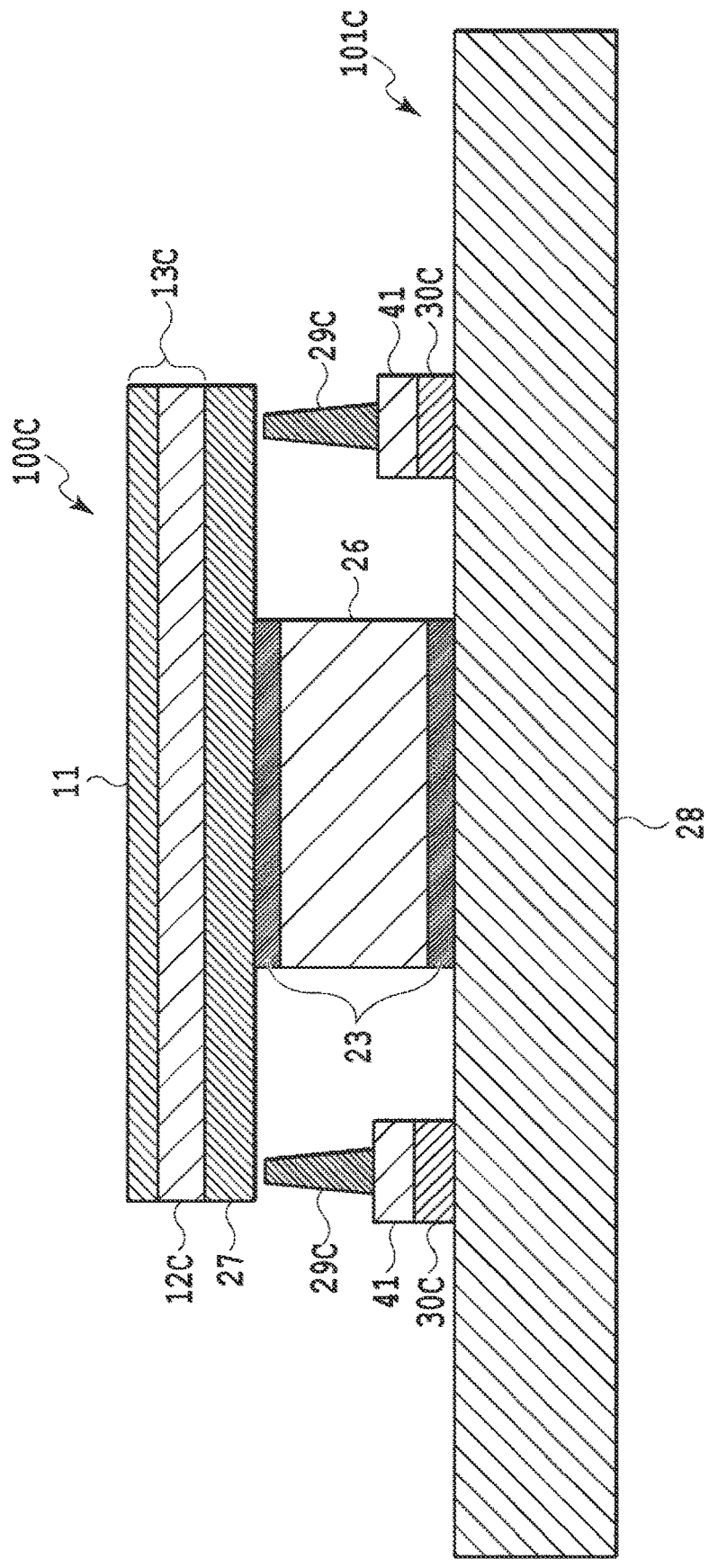
FIG. 8 is a schematic cross-sectional view illustrating, from a side surface direction, a basic configuration of a mounting structure of a wavelength converter according to a third embodiment of the present invention.

FIG. 8 is a schematic cross-sectional view illustrating, from a side surface direction, a basic configuration of a mounting structure 101C of a wavelength converter 100C according to a third embodiment of the present invention.

With reference to FIG. 8, in the mounting structure 101C of this wavelength converter 100C, a temperature control member 41 is interposed between the bottom surface of the support structure 29C with a small height on the side opposite to the tip end surface and a thickness control member 30C provided on the top surface of the metal housing bottom surface member 28. This temperature control member 41 is a temperature control mechanism that performs the temperature control of the wavelength conversion element 13C, and a Peltier element is used as an example. Specifically, the mounting structure 101C of this wavelength converter 100C includes the temperature control member 41 having a temperature control function at the support structure 29C, in addition to the support structure 29B and the thickness control member 30A according to the second embodiment.

Other configurations are the same as those of the first embodiment. Specifically, the wavelength converter 100C includes the wavelength conversion element 13C, the combiner 14, and the separator 15 (not illustrated in the drawing). The wavelength conversion element 13C is provided with the light waveguide core 11 at one main surface and includes, as a base, the substrate 12C having a lower refractive index for signal light than the light waveguide core 11. The wavelength conversion element 13C is a waveguide type, and its polarization is periodically inverted. The wavelength conversion element 13C generates light of a wavelength different from that of signal light when the signal light is input. In addition, also in this wavelength converter 100C, one main surface of the support member 27 is joined by bonding or the like on the other main surface of the substrate 12C of the wavelength conversion element 13C. The material of the substrate 12C is the same as the material of the substrate 12A described above in the first embodiment.

In the mounting structures 101A and 101B according to the above-mentioned embodiments, even when the temperature control element 26 is cooled at a low temperature, the lower portion of the other main surface of the support member 27 and the tip end surfaces of the support structures 29A and 29B come into contact with each other. As such, the heat from the metal housing bottom surface member 28 is transferred to the lower portion of the other main surface of the support member 27 through the support structures 29A and 29B. This makes it necessary to control the heat transferred from the support structures 29A and 29B to the lower portion of the support member 27.

In view of this, in the mounting structure 101C, when the support structure 29C is mounted to the top surface of the metal housing bottom surface member 28, the temperature control member 41 that controls the temperature of the wavelength conversion element 13C is interposed at the bottom surface of the support structure 29C. More specifically, the temperature control member 41 that controls the temperature of the support member 27 is required to be sandwiched at the bottom surface of the support structure 29C such that the thickness control member 30C disposed upward. In other words, it is regarded that the temperature control member 41 composed of a Peltier element is interposed between the bottom surface of the support structure 29C on the side opposite to the tip end surface and the thickness control member 30C provided on the top surface of the metal housing bottom surface member 28. Further, it is regarded that the wavelength conversion element 13C is placed at the surface on the side opposite to the joint surface to the substrate 12C of the support member 27. In addition to the above-described Peltier element, a heater such as a ceramic heater can be used to the temperature control member 41 when the use temperature is higher than room temperature.

Specifically, in this mounting structure 101C, the heat transferred from the metal housing bottom surface member 28 to the lower portion of the support member 27 can be controlled using the temperature control member 41 while moving up and down the position of the tip end surface of the support structure 29C. Thus, it is possible to control the light coupling efficiency of the signal light 1a and the control light $1b_{IN}$ for input, to the light waveguide core 11. This control of the light coupling efficiency means that the light intensity of the emission light of the wavelength converted light 1c and the control light $1b_{OUT}$ for output can be controlled by changing the light intensity of the incident light of the signal light 1a and the control light $1b_{IN}$ for input on the light waveguide core 11. In addition, the temperature distribution can be changed by simultaneously causing a thermal conduction at the light waveguide core 11 and the substrate 12C of the wavelength conversion element 13C by contact through the support member 27.

For example, assuming that the temperature of a portion around both end portions of the light waveguide core 11 is increased by intentionally causing a thermal conduction by the support structure 29C at the light waveguide core 11, the substrate 12C, and the support member 27 with a uniform temperature. In this case, the wavelength of the wavelength converted light 1c obtained at a center portion of the light waveguide core 11 is shifted from a desired wavelength due to a variation of the phase matching condition due to a change in effective refractive index caused by a temperature change at a portion around both end portions of the light waveguide core 11. Thus, because the light spectrum intensity at a desired wavelength is reduced and wavelength conversion to a wide wavelength is performed, the obtained wavelength converted light 1c indicates a wide light spectrum distribution. In this manner, the light spectrum intensity with the desired wavelength converted light 1c at the light waveguide core 11 is reduced. As a result, it is possible to achieve light intensity control of the emission light output from the wavelength converter 100C.

Figure 9:
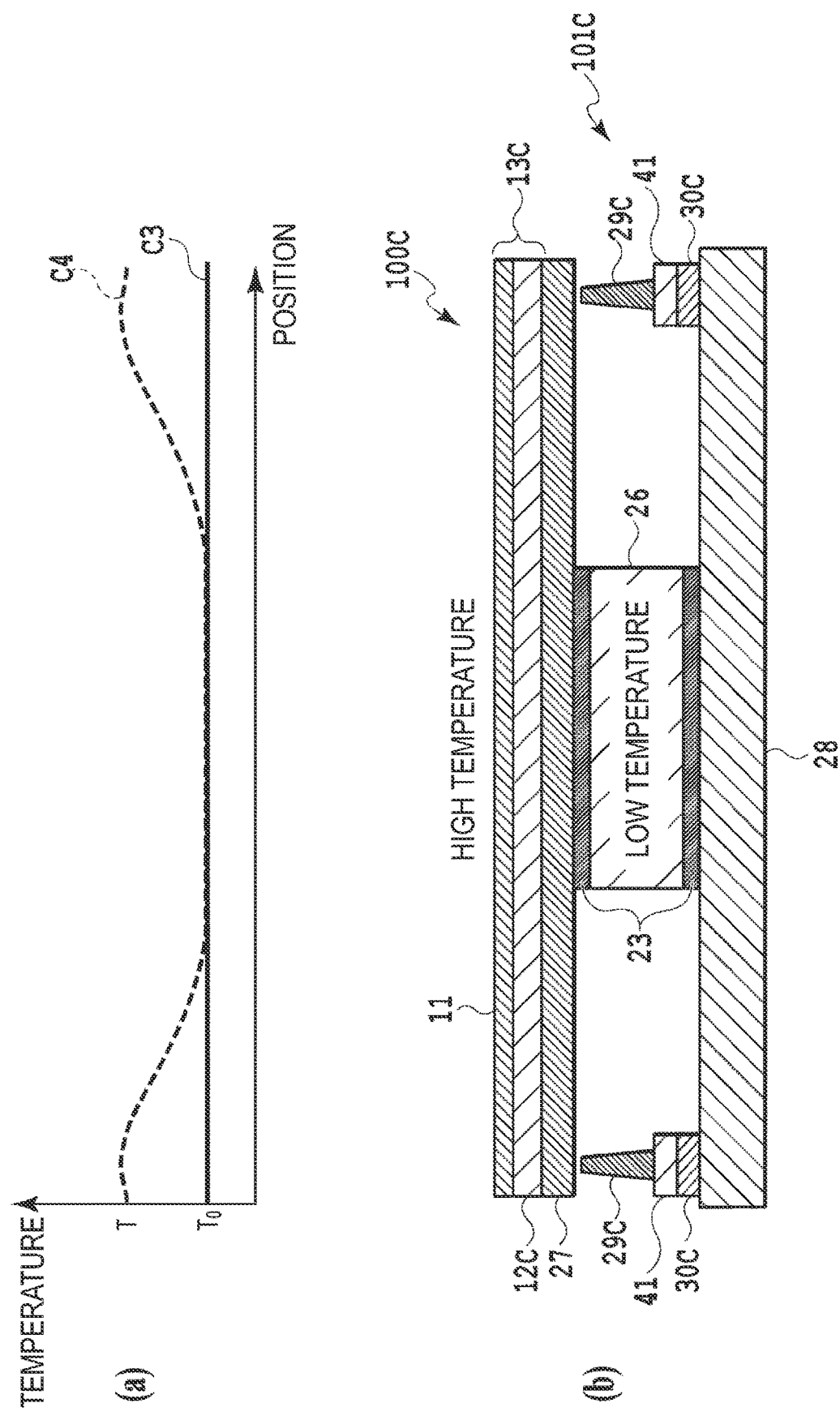
FIG. 9 is a diagram for describing a state of a temperature control performed by a temperature control member on a wavelength conversion element in the mounting structure of the wavelength converter illustrated in FIG. 8.

FIG. 9 is a diagram for describing a state of a temperature control performed by the temperature control member 41 on the wavelength conversion element 13C in the mounting structure 101C of the wavelength converter 100C. FIG. 9(a) is a diagram illustrating optical characteristics C3 and C4 representing a relationship between the height (position) of the light waveguide core 11 of the wavelength converter 100C and the temperature. FIG. 9(b) is a schematic cross-sectional view illustrating, from a side surface direction, the mounting structure 101C of the wavelength converter 100C during temperature control. FIG. 9(b) illustrates an overview of a temperature distribution indicating a rough temperature control state including a temperature control performed by the temperature control member 41 on the wavelength conversion element 13C and a temperature control performed by the temperature control element 26 on the wavelength conversion element 13C.

With reference to FIG. 9(a), here, an overview of a wavelength conversion efficiency control of the wavelength conversion element 13C by the temperature distribution variation of the light waveguide core 11 is illustrated. As described above, in the case where the control light $1b_{IN}$ for input with a large light intensity is entered into the light waveguide core 11, the light waveguide core 11 is heated by the heat conversion due to light absorption even with a slight light absorption. In view of this, to maximize the light conversion efficiency, it is necessary to control the temperature of the temperature control element 26 such that the temperature of the light waveguide core 11 is set to a constant temperature To in all portions as in the optical characteristics C3 indicated by the solid line.

With reference to FIG. 9(b), assume here that during the temperature control of the temperature control element 26 in accordance with the optical characteristics C3 of FIG. 9(a), the support structure 29C is set to a temperature T higher than the surface of the temperature control element 26 as in optical characteristics C4 indicated by the dotted line. In this case, the temperature of the support member 27 of the lower portion corresponding to both end portions of the light waveguide core 11 rises. As a result, as shown the optical characteristics C4, the temperature of both end portions of the light waveguide core 11 is higher than that at the center portion, and the temperature is not constant. As a result, due to the temperature dependency of the effective refractive index of the light waveguide core 11, the periodically poled structure of both end portions of the light waveguide core 11 collapses, and the phase matching condition is shifted. Thus, in the entirety of the wavelength conversion element 13C, the wavelength conversion efficiency is reduced, and the light intensity of the emission light of the wavelength converted light 1c is reduced. As a result, it is possible to achieve light intensity control of the emission light output from the wavelength converter 100C. Note that a similar effect can be obtained by reducing the temperature of the support structure 29C.

In the mounting structure 101C of the wavelength converter 100C described above, the support structure 29C is provided at the top surface of the housing bottom surface member 28 with the temperature control member 41 and the thickness control member 30C interposed therebetween. Further, in the structure, the temperature control of the wavelength conversion element 13C of the wavelength converter 100C can be performed by the temperature control mechanism of the temperature control member 41, and the height of the tip end surface of the support structure 29B can be controlled by the expansion and contraction mechanism of the thickness control member 30C. Thus, the variation in light coupling efficiency of the wavelength conversion element 13C due to the elastic deformation that is generated by the thermal stress due to the temperature gradient and the thermal expansion coefficient difference between the wavelength conversion element 13C and the support structure 29C can be accurately controlled.

In this manner, the wavelength converter 100C that applies the mounting structure 101C does not easily cause the variation in light coupling efficiency to the light waveguide core 11 and the variation in effective refractive index of the light waveguide core 11 due to the photoelastic effect of the thermal stress, and thus the light intensity of the output is stabilized. As a result, the wavelength converter 100C can control the output power intensity of wavelength-converted light even when it is applied to an optical module that requires the same high light intensity incidence, and thus the light transmission path can be stably operated.

Figure 10:
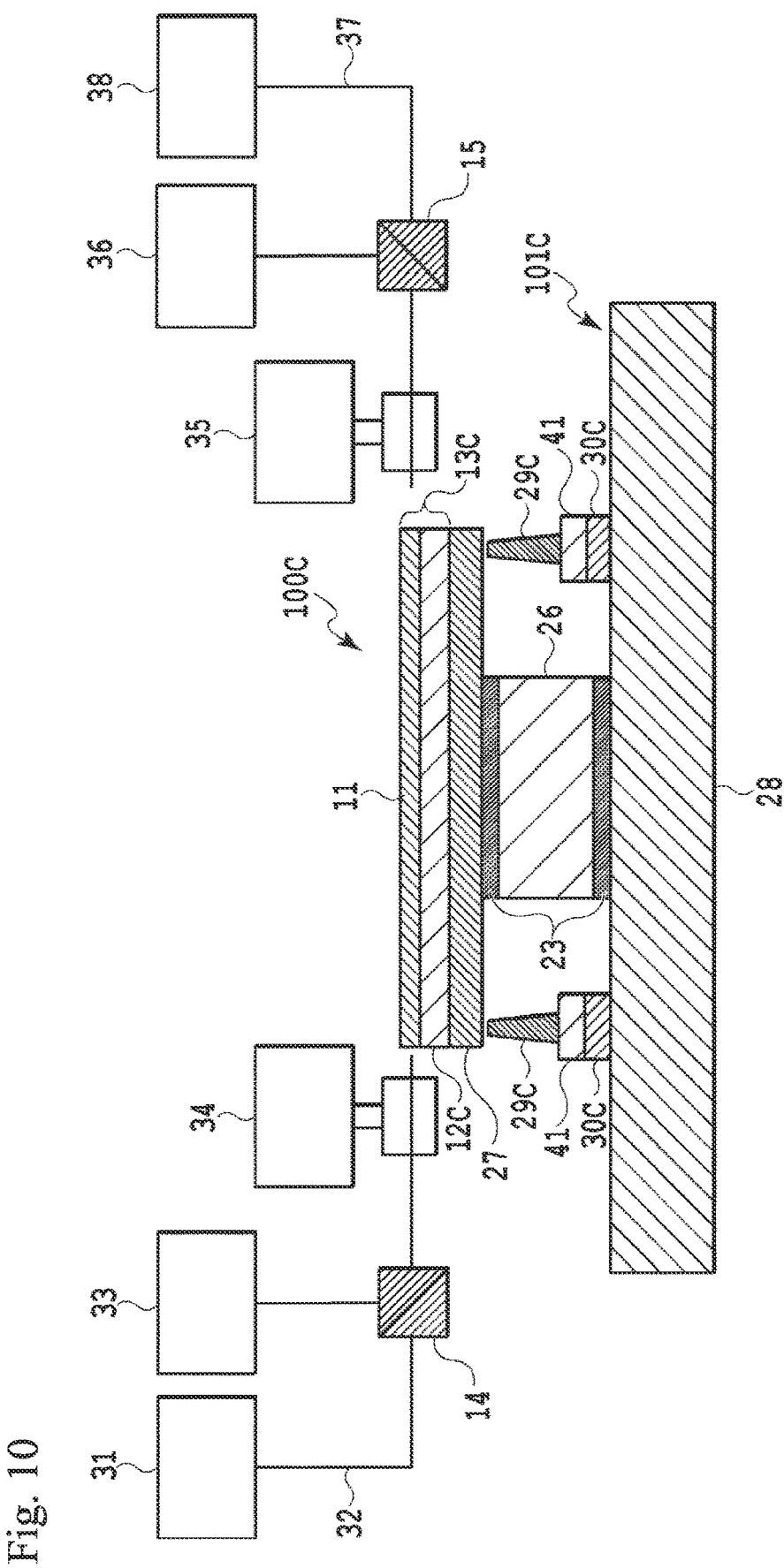
FIG. 10 is a block diagram illustrating a specific example of a peripheral device applied to the mounting structure of the wavelength converter illustrated in FIG. 8.

FIG. 10 is a block diagram illustrating a specific example of a peripheral device applied to the mounting structure 101C of the wavelength converter 100C.

With reference to FIG. 10, the peripheral device of the wavelength converter 100C includes a laser light source 31, a control light generation unit 33, and an alignment apparatus 34 on the input side connected to the combiner 14. The laser light source 31 and the combiner 14 are connected to each other through an optical fiber 32. In addition, the peripheral device of the wavelength converter 100C includes an alignment apparatus 35 on the output side, a control light reception unit 36, and a wavelength converted light reception unit 38 connected to the separator 15. The wavelength converted light reception unit 38 and the separator 15 are connected to each other through an optical fiber 37.

In the wavelength converter 100C with such a peripheral device, a fundamental wave with a wavelength of 1550 nm is input to the combiner 14 through the optical fiber 32 as the signal light 1a emitted from the laser light source 31. In addition, the control light $1b_{IN}$ for input is input to the combiner 14 from the control light generation unit 33. The combiner 14 combines the signal light 1a and the control light $1b_{IN}$ for input, and emits it toward the input side end part of the light waveguide core 11 of the wavelength conversion element 13C. At this time, the alignment apparatus 34 on the input side performs a spatial position control that optically couples the control light $1b_{IN}$ for input and the signal light 1a emitted from the combiner 14 to the light waveguide core 11 of the wavelength conversion element 13C, and thus the light coupling efficiency is maximized.

The signal light 1a and the control light $1b_{IN}$ for input which have been position-controlled from the combiner 14 are subjected to wavelength conversion by the wavelength conversion element 13C, and become the wavelength converted light 1c and the control light $1b_{OUT}$ for output, respectively, with a wavelength of 775 nm of a secondary harmonic different from the wavelength of the signal light 1a. The wavelength converted light 1c and control light $1b_{OUT}$ are also position-controlled by the alignment apparatus 35 on the output side, and emitted toward the separator 15. The separator 15 separates the wavelength converted light 1c and the control light $1b_{OUT}$ for output with a wavelength of 775 nm, outputs the wavelength converted light 1c to the wavelength converted light reception unit 38 through the optical fiber 37, and outputs the control light $1b_{OUT}$ for output to the control light reception unit 36.

In the configuration illustrated in FIG. 10 and in the schematic configuration diagram of the present example, the alignment apparatus 34 on the input side and the alignment apparatus 35 on the output side that perform the spatial position control using the optical fibers 32 and 37 are exemplified. Alternatively, the same effect can be obtained also by applying a spatial optical system alignment apparatus that controls the position of a reflection mirror and a condenser lens. Commonly, for the wavelength converter 100C, the positions of the alignment apparatus 34 on the input side and the alignment apparatus 35 on the output side are set to maximize the light transmittance at a target temperature. Then, YAG welding, fixing and bonding with adhesive agent, screw-fixing or the like are performed at the set position.

In the wavelength converter 100C according to the third embodiment, the wavelength conversion element 13C was formed in the following manner. $LiTaO_3$ was used for the substrate 12C. For the light waveguide core 11, a comb-shaped electrode structure is formed in advance with copper and the comb-shaped electrode structure was bonded to the top surface of the substrate 12C with $LiNbO_3$ with the Z axis forming a periodic polarization structure at a high voltage of approximately 1000 V, the Z axis being a plane perpendicular to the substrate 12C. Then, after thin film polishing, the ridge-shaped light waveguide core 11 was formed at the top surface of the substrate 12C by a dry etching method using Ar plasma, and the end surface was cut by a dicing saw. In this manner, for the signal light 1a and the control light $1b_{IN}$ for input, a non-reflection coating at the wavelength of the signal light 1a and the control light $1b_{IN}$ for input light was formed with a metal multilayer film or the like on the end surface. In this manner, the wavelength conversion element 13C was formed.

Next, the produced wavelength conversion element 13C was fixed to one main surface of the support member 27 made of copper, and the temperature control element 26 with the interposed joining member 23 was fixed and bonded between the top surface of the metal housing bottom surface member 28 made of brass and the support member 27. For the joining member 23, a silver paste resin composed of a thermosetting epoxy resin filled with silver filler may be exemplified. In this case, it can be bonded and fixed through approximately 110° C. heating and curing.

The mounting structure 101C of the third embodiment further requires the support structure 29C made of metal that supports the wavelength conversion element 13C at positions corresponding to both end portions of the light waveguide core 11 at the occurrence of elastic deformation of the wavelength conversion element 13C. The support structure 29C includes the temperature control member 41 that can control the temperature of the wavelength conversion element 13C together with the thickness control member 30C that can control the height (position) of the tip end surface. For the thickness control member 30C, a PZT piezoelectric element that can control the height using the voltage is used in an example. For the temperature control member 41, a Peltier element that can control the temperature is used in the example. In view of this, the thickness control member 30C and the temperature control member 41 are disposed in a stacked manner between the top surface of the metal housing bottom surface member 28 and the bottom surface of the support structure 29C. For the stack of the thickness control member 30C and the temperature control member 41, silver paste resin is used in the example. Thereafter, wiring connections were made using gold thin wire, and the support structure 29C set with a height high enough to be close to the lower surface of the support member 27 was interposed at the tip of each part, and the part serving as the lower portion was fixed to finish the mounting structure 101C.

Thereafter, after confirming that the wavelength conversion element 13C has reached an intended use temperature of 55° C. using a contact thermometer and/or a radiation thermometer, the position of the optical system member is controlled using the alignment apparatuses 34 and 35 such that the light transmittance is maximized. Then, the wavelength converter 100C is finished by performing fixing after the alignment. Then, a voltage was applied to the thickness control member 30C at the lower portion of the support structure 29C, to deform the end portion of the wavelength conversion element 13C and the support member 27 upward by 1 μm or more. As a result, the control light $1b_{IN}$ for input was slightly reduced, and the light intensity of the wavelength converted light $1c$ was reduced by approximately 1%. Further, when the temperature control member 41 at the lower portion of the support structure 29C was set to 75° C., which is a temperature approximately 20° C. higher, it was confirmed that the light intensity of the wavelength converted light $1c$ was reduced by approximately 1%. As a result, it was confirmed that it is possible to control the variation in light coupling efficiency of the wavelength conversion element 13C due to the elastic deformation caused by the thermal stress due to the temperature gradient and the thermal expansion coefficient difference between the wavelength conversion element 13C and the support structure 29C.

The invention claimed is:

1. A wavelength converter configured to generate light with a wavelength different from a wavelength of a signal light when the signal light is input, the wavelength converter comprising:
    a wavelength conversion element including a substrate as a base with a light waveguide core at a first main surface, the substrate having a lower refractive index for the signal light than the light waveguide core, the wavelength conversion element being configured to convert the wavelength of the signal light;
    a temperature control element joined to a portion excluding both of one end portion and another end portion in a second main surface of the substrate, and configured to support the wavelength conversion element and control a temperature of the wavelength conversion element;
    a support structure configured to support the wavelength conversion element through a contact at a tip end surface at a position corresponding to at least one end portion of the light waveguide core in the second main surface of the substrate at occurrence of elastic deformation due to a thermal stress during wavelength conversion of the wavelength conversion element; and
    a metal housing bottom surface member disposed at a bottom surface inside a metal housing configured to house the wavelength conversion element, the metal housing bottom surface member being a member where the support structure is provided,
    wherein the support structure is provided at a portion apart from the temperature control element at a top surface of the metal housing bottom surface member, and the tip end surface is disposed in a vicinity of the position in the second main surface of the substrate,
    wherein the support structure includes a temperature control mechanism configured to perform a temperature control of the wavelength conversion element from a side of the second main surface of the substrate.

2. The wavelength converter according to claim 1, further comprising a support member having a first main surface joined to the second main surface of the substrate,
    wherein the temperature control element is joined to a portion excluding both of one end portion and another end portion in a second main surface of the support member, and supports the wavelength conversion element; and
    the support structure is disposed in such a manner that the tip end surface is disposed in a vicinity of a position corresponding to at least one end portion of the light waveguide core in the second main surface of the support member, the support structure being configured to support the wavelength conversion element through a contact at the tip end surface at the position in the second main surface of the support member at the occurrence of elastic deformation.

3. The wavelength converter according to claim 1, wherein the support structure includes an expansion and contraction mechanism configured to expand and contract in a direction perpendicular to the first main surface of the substrate with respect to a propagation direction of light of the light waveguide core at the first main surface of the substrate.

4. The wavelength converter according to claim 3,
    wherein a Peltier element is used in the temperature control mechanism as a temperature control member; and
    the Peltier element is interposed between a bottom surface of the support structure on a side opposite to the tip end surface and the expansion and contraction mechanism provided at a top surface of the metal housing bottom surface member.

5. The wavelength converter according to claim 1, further comprising:
    a combiner configured to combine the signal light and control light; and
    a separator configured to separate control light and wavelength converted light with a wavelength different from a wavelength of the signal light by the wavelength conversion element.

6. The wavelength converter according to claim 5, wherein the substrate is a material of any of $LiNbO_3$, $KNbO_3$, $LiTaO_3$, $LiNb(x)Ta(1-x)O_3$ (note that 0≤x≤1) and $KTiOPO_4$, or a material of any of $LiNbO_3$, $KNbO_3$, $LiTaO_3$, $LiNb(x)Ta(1-x)O_3$ (note that 0≤ x≤1) and $KTiOPO_4$ that contains at least one material selected from Mg, Zn, Sc, and In as an additive.

7. The wavelength converter according to claim 6, wherein the wavelength conversion element is a waveguide type, and its polarization is periodically inverted.

* * * * *